United States Patent
Lee et al.

(10) Patent No.: US 9,299,581 B2
(45) Date of Patent: Mar. 29, 2016

(54) METHODS OF DRY STRIPPING BORON-CARBON FILMS

(75) Inventors: Kwangduk Douglas Lee, Redwood City, CA (US); Sudha Rathi, San Jose, CA (US); Ramprakash Sankarakrishnan, San Jose, CA (US); Martin Jay Seamons, San Jose, CA (US); Irfan Jamil, San Jose, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 963 days.

(21) Appl. No.: 13/456,404

(22) Filed: Apr. 26, 2012

(65) Prior Publication Data

US 2012/0285492 A1    Nov. 15, 2012

Related U.S. Application Data

(60) Provisional application No. 61/485,534, filed on May 12, 2011.

(51) Int. Cl.
  *B08B 5/00* (2006.01)
  *H01L 21/311* (2006.01)
  *H01L 21/02* (2006.01)

(52) U.S. Cl.
  CPC ...... *H01L 21/31122* (2013.01); *H01L 21/0206* (2013.01); *H01L 21/31144* (2013.01)

(58) Field of Classification Search
  None
  See application file for complete search history.

(56) References Cited

U.S. PATENT DOCUMENTS

| | | |
|---|---|---|
| 4,975,144 A | 12/1990 | Yamazaki et al. |
| 6,165,891 A | 12/2000 | Chooi et al. |
| 6,352,921 B1 | 3/2002 | Han et al. |
| 6,413,852 B1 | 7/2002 | Grill et al. |
| 6,541,397 B1 | 4/2003 | Bencher |
| 6,852,647 B2 | 2/2005 | Bencher |
| 6,884,733 B1 | 4/2005 | Dakshina-Murthy et al. |
| 6,939,794 B2 | 9/2005 | Yin et al. |

(Continued)

FOREIGN PATENT DOCUMENTS

JP          05217965 A  *  8/1993
KR    10-2007-0081649 A     8/2007

OTHER PUBLICATIONS

International Search Report, PCT/US2012/063651 dated Mar. 20, 2013.

(Continued)

*Primary Examiner* — Eric Golightly
(74) *Attorney, Agent, or Firm* — Patterson & Sheridan, LLP (57) ABSTRACT

Embodiments of the invention generally relate to methods of dry stripping boron-carbon films. In one embodiment, alternating plasmas of hydrogen and oxygen are used to remove a boron-carbon film. In another embodiment, co-flowed oxygen and hydrogen plasma is used to remove a boron-carbon containing film. A nitrous oxide plasma may be used in addition to or as an alternative to either of the above oxygen plasmas. In another embodiment, a plasma generated from water vapor is used to remove a boron-carbon film. The boron-carbon removal processes may also include an optional polymer removal process prior to removal of the boron-carbon films. The polymer removal process includes exposing the boron-carbon film to $NF_3$ to remove from the surface of the boron-carbon film any carbon-based polymers generated during a substrate etching process.

8 Claims, 4 Drawing Sheets (56) References Cited

U.S. PATENT DOCUMENTS

| | | |
|---|---|---|
| 7,407,893 B2 | 8/2008 | Seamons et al. |
| 7,576,441 B2 | 8/2009 | Yin et al. |
| 7,638,440 B2 | 12/2009 | Wang et al. |
| 8,337,950 B2 | 12/2012 | Nguyen et al. |
| 2001/0007788 A1 | 7/2001 | Chang et al. |
| 2002/0045355 A1 | 4/2002 | Chong et al. |
| 2002/0086547 A1 | 7/2002 | Mui et al. |
| 2004/0259355 A1 | 12/2004 | Yin et al. |
| 2005/0202683 A1 | 9/2005 | Wang et al. |
| 2006/0003582 A1 | 1/2006 | Roh |
| 2006/0006502 A1 | 1/2006 | Yin et al. |
| 2006/0199393 A1 | 9/2006 | Lee et al. |
| 2006/0240656 A1 | 10/2006 | Ahn |
| 2012/0285481 A1 | 11/2012 | Lee et al. |
| 2012/0285492 A1 | 11/2012 | Lee et al. |

OTHER PUBLICATIONS

International Search Report, PCT/US2012/035659 dated Feb. 7, 2013.

Chavez, et al., "Ion-implanted photoresist removal using water/carbon dioxide mixtures at elevated temperatrue and pressure," Journal of Vaccuum Science & Technology B, vol. 19, Issue 6, 2001 (Abstract only).

* cited by examiner

METHODS OF DRY STRIPPING BORON-CARBON FILMS

CROSS-REFERENCE TO RELATED APPLICATIONS

This application claims benefit of U.S. provisional patent application Ser. No. 61/485,534, filed May 12, 2011, which is herein incorporated by reference.

BACKGROUND OF THE INVENTION

1. Field of the Invention

Embodiments of the invention generally relate to methods of dry stripping boron-carbon films.

2. Description of the Related Art

Boron-carbon films, such as boron-doped carbon, have demonstrated superior patterning performance as compared to amorphous carbon when being used as an etching hardmask. However, boron-carbon films are not easily stripped, since boron-carbon films cannot be ashed using an oxygen plasma. Boron carbon films can be dry stripped using fluorine or chlorine along with oxygen; however, fluorine and chlorine are corrosive to dielectric materials such as silicon oxide, silicon nitride, and silicon oxynitride commonly found on semiconductor substrates. A wet etch solution containing sulfuric acid and hydrogen peroxide can also remove the boron-carbon films; however, the wet etch solution can damage exposed metal surfaces or embedded metals also commonly found on semiconductor substrates.

Therefore, there is a need for an improved method of removing boron-carbon films from substrates.

SUMMARY OF THE INVENTION

Embodiments of the invention generally relate to methods of dry stripping boron-carbon films using oxygen-containing oxidizing agents in combination with hydrogen-containing reducing agents. In one embodiment, alternating plasmas of hydrogen and oxygen are used to remove a boron-carbon film. In another embodiment, co-flowed oxygen and hydrogen plasma is used to remove a boron-carbon containing film. A nitrous oxide plasma may be used in addition to or as an alternative to either of the above oxygen plasmas. In another embodiment, a plasma generated from water vapor is used to remove a boron-carbon film. The boron-carbon removal processes may also include an optional polymer removal process prior to removal of the boron-carbon films. The polymer removal process includes exposing the boron-carbon film to a plasma formed from an oxygen-containing gas, a fluorine-containing gas, or a combination thereof to remove from the surface of the boron-carbon film any carbon-based polymers generated during a substrate etching process.

In one embodiment, a method for stripping a film from a substrate comprises positioning a substrate having a film thereon in a chamber, wherein the film includes at least one of boron or carbon. The film is then exposed to oxygen ions or radicals and hydrogen ions or radicals to generate one or more volatile compounds, and the one or more volatile compounds are exhausted from the chamber.

In another embodiment, a method for stripping a boron-carbon film from a substrate positioned in a chamber comprises exposing a substrate comprising boron and carbon to a plasma containing oxygen radicals or ions and hydrogen radicals or ions. The hydrogen radicals or ions are reacted with the boron to form a volatile boron species, and the oxygen radicals or ions are reacted with the carbon to form a volatile carbon species. The volatile boron species and the volatile carbon species are then removed from the chamber.

In another embodiment, a method for stripping a film from a substrate positioned in a chamber comprises exposing a substrate to a plasma formed from a compound comprising $H_xO_y$, where x and y are integers or non-integers greater than 1. The film is then contacted with the plasma to form one or more volatile species, and the volatile species are removed from the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to methods of dry stripping boron-carbon films using oxygen-containing oxidizing agents in combination with hydrogen-containing reducing agents. In one embodiment, alternating plasmas of hydrogen and oxygen are used to remove a boron-carbon film. In another embodiment, co-flowed oxygen and hydrogen plasma is used to remove a boron-carbon containing film. A nitrous oxide plasma may be used in addition to or as an alternative to either of the above oxygen plasmas. In another embodiment, a plasma generated from water vapor is used to remove a boron-carbon film. The boron-carbon removal processes may also include an optional polymer removal process prior to removal of the boron-carbon films. The polymer removal process includes exposing the boron-carbon film to a plasma formed from an oxygen-containing gas, a fluorine-containing gas, or a combination thereof to remove from the surface of the boron-carbon film any carbon-based polymers generated during a substrate etching process.

Embodiments of the invention may be practiced in the Producer® SE or Producer® GT chambers available from Applied Materials, Inc., of Santa Clara, Calif. It is contemplated that other chambers, including those produced by other manufacturers, may benefit from embodiments described herein.

Figure 1:
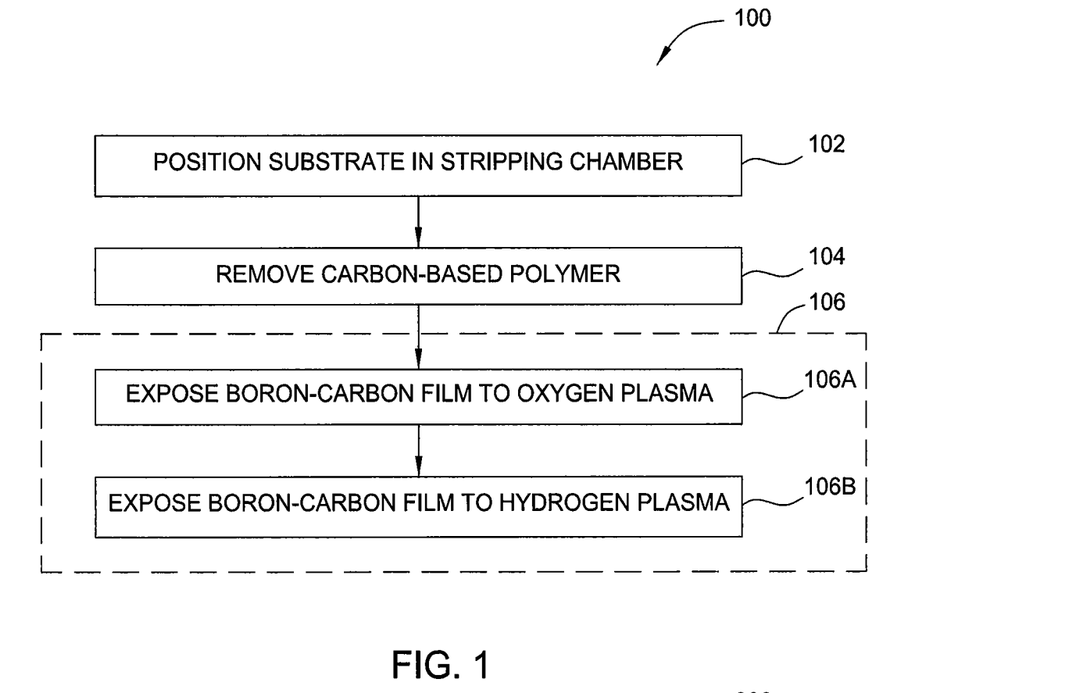
FIG. 1 is a flow diagram illustrating a method of removing a boron-carbon film using alternating hydrogen and oxygen plasmas according to one embodiment of the invention.

FIG. 1 is a flow diagram 100 illustrating a method of removing a boron-carbon film using alternating hydrogen and oxygen plasmas according to one embodiment of the invention. Flow diagram 100 begins at operation 102, in which a substrate having a boron-carbon film thereon, such as a boron-carbon hardmask, is positioned on a substrate support within a stripping chamber. The substrate and the boron-carbon film thereon are heated to a temperature less than about 750° C., such as about 200° C. to about 400° C. The boron-carbon film may be a boron-doped carbon, or a hydrogenated boron carbide having an atomic ratio of boron to carbide of about 2:1 or less. The substrate is generally a silicon-containing substrate, such as a 300 millimeter silicon wafer, and may have one or more dielectric or conductive metal layers disposed thereon. For example, the substrate may have a silicon dioxide layer disposed thereon, over which the boron-carbon layer is disposed to act as an etching hardmask during a previously performed etching of the silicon dioxide layer. It is contemplated that substrates other than silicon-containing substrates may be used.

After positioning the substrate on a support, carbon-based polymers located on the boron-carbon film are optionally removed in a polymer removal operation 104. The carbon-based polymers are generated on the upper surface of the boron-carbon layer during a previously performed etching process in which the boron-carbon layer acts as an etching hardmask. During the etching, the substrate and the boron-carbon layer thereon are exposed to an etchant, such as $C_4F_8$, to etch a desired pattern into the substrate. Due to polymerization of carbon and fluorine, the etching process produces a carbon-based polymer, which may also include silicon and/or oxygen. The carbon-based polymer is generally removed prior to the stripping process to remove higher molecular weight molecules to allow for more efficient stripping of the boron-carbon film.

The carbon-based polymer is removed from the surface of the boron-carbon film by exposing the carbon-based polymer to a plasma formed from a fluorine-containing gas, an oxygen-containing gas, or a combination thereof. For example, the carbon-based polymer may be removed using a plasma formed from oxygen gas and $NF_3$ having a ratio of about 100:1. Generally, the amount of fluorine desired in the plasma increases with the amount of silicon present in the carbon-based polymer. Since oxygen-containing plasmas are capable of removing the carbon-based polymer, especially when the carbon-based polymer contains relatively low amounts of silicon, operation 104 can be omitted due to the exposure of the substrate to an oxygen-containing plasma in operation 106 (discussed below).

During the polymer removal process, a remotely generated plasma using oxygen gas and $NF_3$ gas is provided to the stripping chamber at a flow rate of about 1 SCCM to about 15,000 SCCM per 300 millimeter substrate, for example, about 100 SCCM to about 5,000 SCCM. The ratio of oxygen to $NF_3$ is about 100:1 to about 1000:1. The pressure within the stripping chamber is maintained at a pressure within a range from about 1 millitorr to about 760 Torr, such as about 4 millitorr to about 10 Torr, while the substrate is maintained at a temperature less than 750° C. The oxygen and the $NF_3$ react with the carbon-based polymer to form a volatile compound which is then exhausted from the stripping chamber. Under such conditions, the carbon-based polymer is removed at a rate of about 2,000 angstroms per minute to about 10,000 angstroms per minute. It is contemplated that the carbon-based polymer may be over-etched to ensure removal from the surface of the substrate.

After removal of the carbon-based polymer layer from the boron-carbon layer, the boron-carbon layer is stripped from the surface of the substrate in operation 106. Operation 106 includes two sub-operations, 106A and 106B. In sub-operation 106A, the boron-carbon layer is exposed to an ionized oxygen-containing compound, such as oxygen plasma, and then subsequently, in sub-operation 106B, the substrate is exposed to an ionized hydrogen-containing compound, such as hydrogen plasma. In sub-operation 106A, the oxygen ions react with the carbon of the boron-carbon film to form a volatile compound (e.g., $CO_2$) which is exhausted from the chamber. After about 10 seconds to about 50 seconds of exposure to the ionized oxygen, the boron-carbon film forms a relatively higher concentration of boron near the surface of the film due to the removal of carbon. The removal rate of the boron-carbon film begins to decrease due to the reduction of available carbon on the surface of the film. At this point, the flow rate of the oxygen-containing compound to the stripping chamber is halted, and the remaining oxygen-containing compound is exhausted from the stripping chamber.

In sub-operation 106B, the boron-carbon layer is exposed to a hydrogen-containing compound plasma which reacts with the boron in the boron-carbon layer to form a volatile compound (e.g., $B_2H_6$) which is then exhausted from the chamber. The boron-carbon layer is exposed to the hydrogen plasma for about 10 seconds to about 50 seconds, until the boron-carbon film has a relatively higher concentration of carbon near the surface of the boron-carbon film. After a predetermined time, the flow of hydrogen gas is halted, and sub-operation 106A is then repeated. Operation 106, which includes sub-operations 106A and 106B, may be repeated a desired amount of times in order to sufficiently remove the boron-carbon film from the substrate surface.

Each of the hydrogen-containing compound and the oxygen-containing compound are provided to the stripping chamber at flow rate of about 5 SCCM to about 15,000 SCCM per 300 millimeter substrate. For example, the hydrogen gas and the oxygen gas may be provided to the stripping chamber at a flow rate of about 500 SCCM to about 10,000 SCCM and about 250 SCCM to about 5000 SCCM, respectively. The hydrogen-containing compound and the oxygen-containing compound are ionized using an RF generator operating at 13.56 MHz which applies about 100 watts to about 3,000 watts of power, for example, about 1,000 watts to about 3,000 watts. The pressure within the stripping chamber is maintained at a pressure within a range from about 1 millitorr to about 760 Torr, such as about 50 millitorr to about 10 Torr, or about 5 Torr to about 100 Torr.

It is to be noted that since the oxygen-containing compound reacts with carbon, and the hydrogen-containing compound reacts with boron, the exposure times of each compound can be tailored based on the atomic composition of the boron-carbon film to effect a desired removal rate. For example, if the boron concentration in the boron-carbon film is about twice the concentration of the carbon in the film, then the hydrogen exposure time may be greater than the oxygen exposure time, such as about two times greater (assuming both plasmas have about the same etch rate).

Flow diagram 100 illustrates one embodiment for removing a boron-carbon film; however, other embodiments are also contemplated. In one embodiment, operations 102, 104, and 106 are all performed in the same chamber. In another embodiment, it is contemplated that operation 104 may occur in a separate chamber, such as an etching chamber, and may occur before positioning the substrate in a stripping chamber. In another embodiment, it is contemplated that the plasma of operation 104 can be a capacitively coupled or inductively coupled in addition to or as an alternative to a remotely generated. For example, it is contemplated that a capacitively coupled plasma may be generated from a fluorine-containing gas and an oxygen-containing gas. Alternatively, a capacitively coupled plasma may be generated from water vapor and an inert gas. In such an embodiment, water vapor may be introduced to the chamber at a flow rate between about 10 SCCM and 10,000 SCCM, such as about 4,000 SCCM. The inert gas may be provided to the chamber at a flow rate of about 3,000 SCCM.

In another embodiment, it is contemplated that other fluorine-containing gases can be used in operation 104. For example, it is contemplated that $CF_4$, $C_3F_6$, $CHF_3$, $CH_2F_2$, and $CH_3F$ may be utilized. In another embodiment, it is contemplated that the $NF_3$ plasma of operation 104 or the oxygen-containing or hydrogen-containing plasmas of operation 106 can be generated in situ via inductive coupling or may be remotely generated. In yet another embodiment, it is contemplated that the oxygen-containing compound and hydrogen-containing compound of operation 106 may be carried to the stripping chamber using a carrier gas, such as argon, helium or nitrogen. The carrier gases may be provided to the stripping chamber containing a 300 millimeter substrate at a flow rate of about 5 SCCM to about 15,000 SCCM. In another embodiment, it is contemplated that the chamber may be flushed between sub-operations 106A and 106B using a carrier gas to avoid reaction between the hydrogen and the oxygen. In yet another embodiment, it is contemplated that sub-operation 106B may be performed prior to sub-operation 106A.

In another embodiment, it is contemplated that any compound which provides oxygen, such as $O_2$, $N_2O$, $CO_2$, $NO$, or $NO_2$, may be used in operation 106. Additionally, it is also contemplated that other hydrogen-containing compounds may be used in addition to or as alternatives to hydrogen gas in operation 106. For example, it is contemplated that ammonia may be used in addition to or as an alternative to hydrogen gas.

In one example, a boron-carbon film having a thickness of about 2000 angstroms is exposed to 1500 SCCM of hydrogen plasma for 30 seconds at a chamber pressure of 7 Torr and substrate temperature of 400° C. The boron-carbon film is then exposed to 1500 SCCM of oxygen plasma for 30 seconds at a chamber pressure of 7 Torr and substrate temperature of 400° C. The boron-carbon film is further exposed to alternating hydrogen and oxygen plasmas until the film is removed. The boron-carbon film was removed in about 20 minutes.

Figure 2:
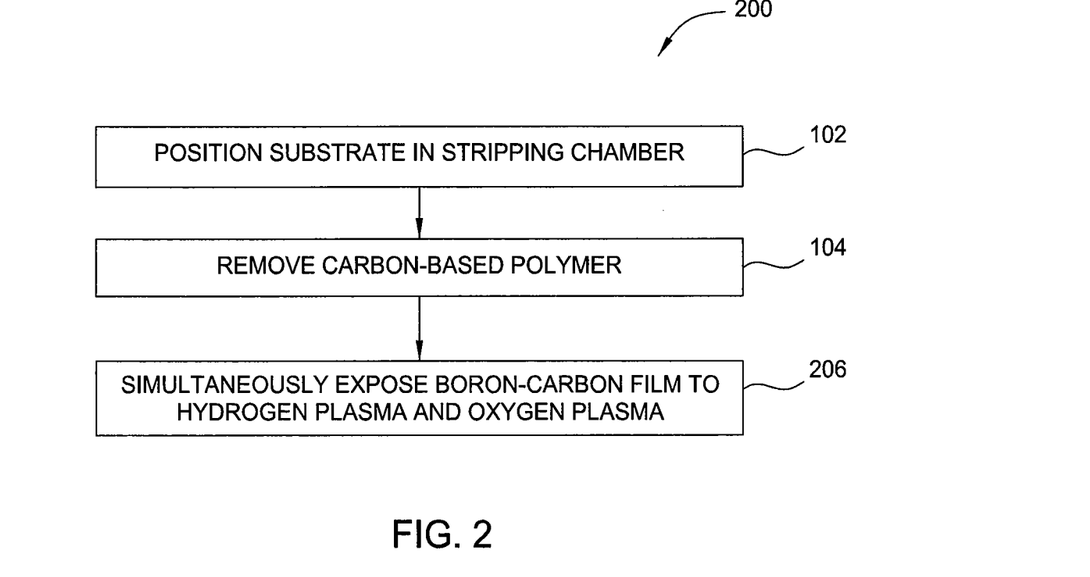
FIG. 2 is a flow diagram illustrating a method of removing a boron-carbon film using a plasma containing both oxygen and hydrogen according to one embodiment of the invention.

FIG. 2 is a flow diagram 200 illustrating a method of removing a boron-carbon film using a plasma containing both oxygen and hydrogen according to one embodiment of the invention. Flow diagram 200 includes operations 102, 104, and 206. Operations 102 and 104 are similar to operations 102 and 104 described with reference to flow diagram 100. After positioning a substrate on a support in operation 102, and removing the carbon-based polymer in operation 104, the substrate and the boron-carbon film thereon are exposed to a plasma or ionized gas formed from a hydrogen-containing compound, such as diatomic hydrogen, and an oxygen-containing compound, such as diatomic oxygen, in operation 206. Thus, while operation 106 of flow diagram 100 exposes the boron-carbon film to a cycle alternating hydrogen-containing and oxygen-containing plasmas, operation 206 exposes the boron-carbon film to simultaneous hydrogen-containing and oxygen-containing plasmas.

In operation 206, the hydrogen-containing compound and oxygen-containing compound are provided to the stripping chamber at flow rate of about 5 SCCM to about 15,000 SCCM per 300 millimeter substrate to remove a boron-carbon layer from the surface of the substrate. For example, the hydrogen-containing compound and the oxygen-containing compound may be provided at a flow rate of about 200 SCCM to about 4,000 SCCM. The hydrogen-containing compound and the oxygen-containing compound are ionized using an RF generator operating at 13.56 MHz and applying about 100 watts to about 3,000 watts of power, such as about 1,500 watts to about 2,000 watts of power. The substrate is maintained at a temperature less than 750° C., such as at about 400° C. The pressure within the stripping chamber is generally maintained at a pressure less than about 20 Torr, such as about 7 Torr to about 19 Torr. By maintaining the chamber pressure at less than about 20 Torr, the probability of oxygen plasma and hydrogen plasma undesirably and dangerously reacting within the stripping chamber is greatly reduced.

The hydrogen-containing plasma and the oxygen-containing plasma within the chamber contact the boron-carbon film and react to form volatile compounds which are then exhausted from the chamber. Since the oxygen generally forms a volatile compound with the carbon in the boron-carbon film, and the hydrogen forms a volatile compound with the boron, it is contemplated that the relative ratio of oxygen to hydrogen (and/or flow rates of oxygen and hydrogen) can be adjusted depending on the composition of the boron-carbon film to effect the desired removal rate. Table 1 illustrates the change in removal rate of a boron-carbon film from the surface of a 300 millimeter substrate using varied process parameters.

TABLE 1

|  | P (Torr) | Power (watts) | T (° C.) | $H_2$ Flow rate (SCCM) | $O_2$ Flow rate (SCCM) | Etch rate (Å/min) |
|---|---|---|---|---|---|---|
| Example 1 | 19 | 1500 | 400 | 1000 | 500 | 140 |
| Example 2 | 19 | 1900 | 400 | 1000 | 500 | 155 |
| Example 3 | 19 | 1900 | 400 | 1500 | 750 | 152 |
| Example 4 | 19 | 1900 | 400 | 700 | 350 | 151 |
| Example 5 | 19 | 1900 | 400 | 400 | 200 | 141 |
| Example 6 | 19 | 1900 | 400 | 1250 | 250 | 116 |
| Example 7 | 19 | 1900 | 400 | 750 | 750 | 102 |
| Example 8 | 19 | 1900 | 400 | 250 | 1250 | 119 |
| Example 9 | 19 | 1900 | 400 | 300 | 300 | 104 |
| Example 10 | 19 | 1900 | 400 | 200 | 400 | 101 |
| Example 11 | 19 | 1500 | 400 | 400 | 200 | 149 |
| Example 12 | 19 | 1500 | 400 | 500 | 1000 | 88 |
| Example 13 | 9 | 1500 | 400 | 1000 | 500 | 107 |

With respect to increased oxygen or hydrogen flow rates, excess oxygen or hydrogen in the plasma generally has little effect on etching rate. The rate of etching is limited by the amount of boron or carbon present on the surface of the boron-carbon film with which the oxygen or hydrogen can form a volatile compound, and generally is not significantly increased with the inclusion of excess process gas. However, it should be noted that the etching rate can be increased through the inclusion of additional process gas when the process gas is the limiting reactant (e.g., excess reactant sites are present on the surface of the boron-carbon film).

Flow diagram 200 illustrates one embodiment of stripping a boron-carbon film; however, other embodiments are also contemplated. In another embodiment, it is contemplated that the oxygen-containing compound and hydrogen-containing compound in operation 206 may be introduced to the stripping chamber using a carrier gas, such as argon, helium, or nitrogen, having a flow rate less than 15,000 SCCM per 300 millimeter substrate. The inclusion of carrier gas to the processing volume may decrease the rate at which the boron-carbon film is etched, but may also increase plasma uniformity and stability.

Figure 3A:
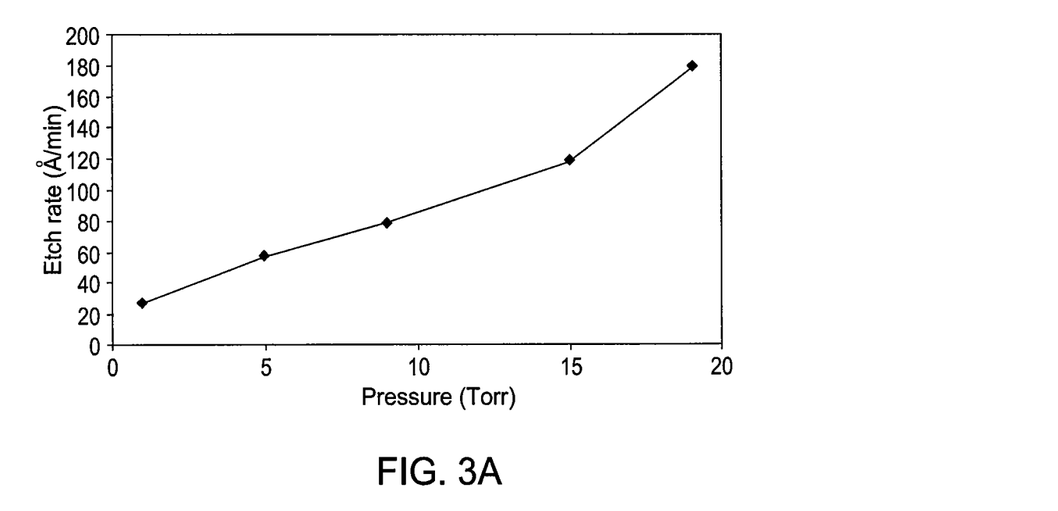
FIGS. 3A and 3B illustrate the effect of chamber pressure and RF power on etch rate when using a plasma containing oxygen and hydrogen.
Figure 3B:
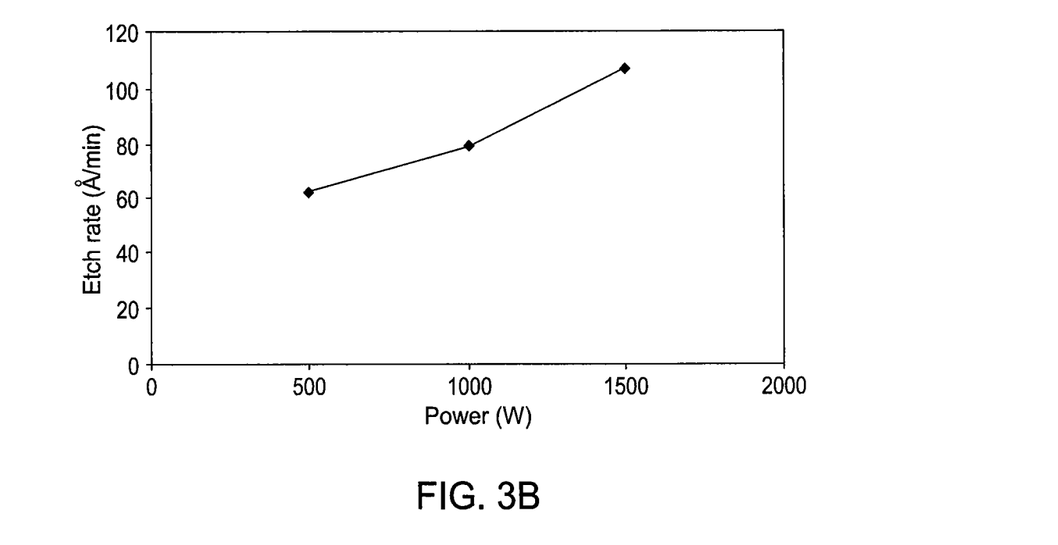

FIGS. 3A and 3B illustrate the effect of chamber pressure and RF power on etch rate when using a plasma containing oxygen and hydrogen. In FIG. 3A, a boron-carbon film at 400° C. was removed from a substrate using a plasma formed from 2,000 SCCM of hydrogen gas and 1,000 SCCM of oxygen gas at 1,000 watts of RF power. As the pressure within the chamber is increased, the etching rate of the boron-carbon film is correspondingly increased. Thus, in all methods described herein, etch rate of the boron-carbon film may be controlled by adjusting the pressure within the chamber. In FIG. 3B, a boron-carbon film at 400° C. was removed using plasma formed from 2,000 SCCM of hydrogen gas and 1,000 SCCM of oxygen gas. The chamber pressure was maintained at 9 Torr. As the RF power applied to the plasma is increased, the etching rate of the boron-carbon film is correspondingly increased.

Figure 4:
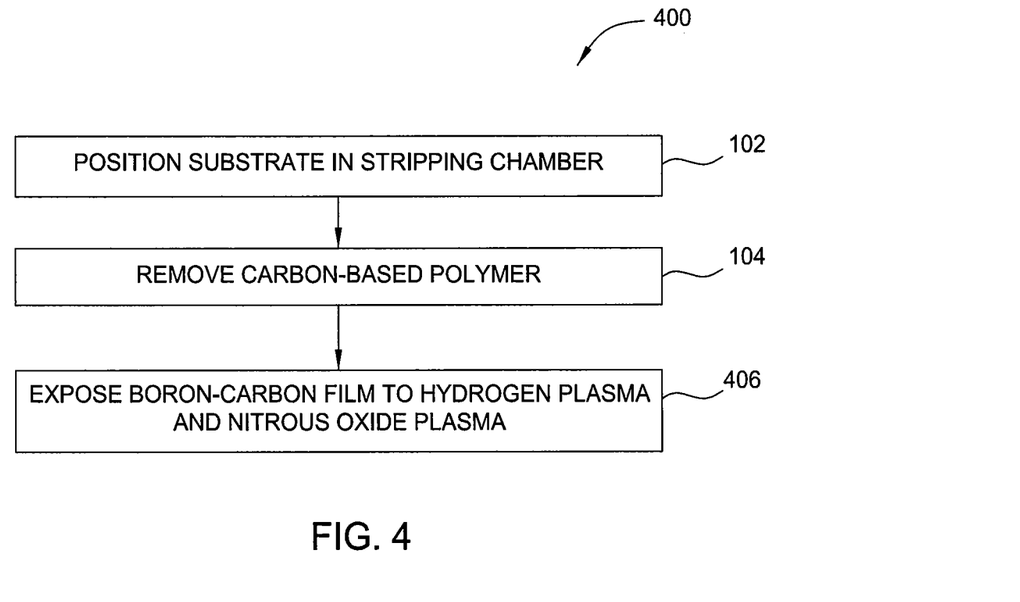
FIG. 4 is a flow diagram illustrating a method of removing a boron-carbon film using plasma generated from hydrogen and nitrous oxide according to one embodiment of the invention.

FIG. 4 is a flow diagram illustrating a method of removing a boron-carbon film using plasma generated from hydrogen and nitrous oxide according to one embodiment of the invention. Flow diagram 400 includes operations 102, 104, and 406. Operations 102 and 104 are similar to operations 102 and 104 described with reference to flow diagram 100. After positioning a substrate on a support in operation 102, and removing the carbon-based polymer in operation 104, the substrate and the boron-carbon film thereon are exposed to a plasma formed from hydrogen and nitrous oxide in operation 406. Thus, while flow diagram 200 uses oxygen as an oxidizing agent to remove carbon from the boron-carbon film, flow diagram 400 uses nitrous oxide as an oxidizing agent. The use of nitrous oxide as an oxidizing agent allows the pressure within the chamber to be increased, thus increasing etch rate, while reducing the probability of undesired reactions occurring within the processing environment as is likely when using oxygen as an oxidizing agent.

In operation 406, hydrogen gas and nitrous oxide gas are provided to the stripping chamber at flow rate of about 5 SCCM to about 15,000 SCCM for a 300 millimeter substrate to remove a boron-carbon layer from the surface of the substrate. For example, the hydrogen gas and the nitrous oxide gas may each be provided at a flow rate of about 200 SCCM to about 4,000 SCCM. The hydrogen gas and the nitrous oxide gas are ionized using an RF generator operating at 13.56 MHz and applying about 100 watts to about 3,000 watts of power, such as about 1,500 watts to about 2,000 watts of power. The substrate is maintained at a heater temperature less than 750° C., such as at about 400° C. The pressure within the stripping chamber is maintained at less than 760 Torr, such as about 40 Torr to about 60 Torr. The nitrous oxide plasma and the hydrogen plasma react with the boron-carbon film to form volatile compounds which are then exhausted from the chamber.

Table 2 illustrates some exemplary process recipes for removing a boron-carbon film from the surface of a 300 millimeter substrate using a plasma formed from hydrogen and nitrous oxide.

TABLE 2

|  | P (Torr) | Power (watts) | T (° C.) | H$_2$ Flow rate (SCCM) | N$_2$O Flow rate (SCCM) | Etch rate (Å/min) |
| --- | --- | --- | --- | --- | --- | --- |
| Example 14 | 49 | 1500 | 400 | 1500 | 750 | 104 |
| Example 15 | 49 | 1500 | 400 | 1000 | 500 | 121 |
| Example 16 | 49 | 1500 | 400 | 500 | 250 | 143 |
| Example 17 | 49 | 1500 | 400 | 250 | 125 | 129 |
| Example 18 | 60 | 2000 | 400 | 1500 | 1000 | 190 |
| Example 19 | 60 | 2000 | 400 | 1125 | 750 | 215 |
| Example 20 | 60 | 2000 | 400 | 750 | 500 | 239 |
| Example 21 | 60 | 2000 | 400 | 375 | 250 | 244 |
| Example 22 | 60 | 2000 | 400 | 225 | 150 | 241 |

As illustrated in Table 2, the use of nitrous oxide as an oxidizing agent generally yields a greater etching rate than when using oxygen as an oxidizing agent. This is due partly to the higher chamber pressures which can be utilized when using nitrous oxide. In another embodiment, it is contemplated that the oxidizing gas may be a mixture of nitrous oxide and oxygen, in which case, the pressure in the chamber may be permitted to exceed 20 Torr. Furthermore, although flow diagram 400 is described with reference to co-flowing nitrous oxide and hydrogen gas, it is contemplated that the nitrous oxide and hydrogen gas be independently provided to the chamber in a cyclical manner. In yet another embodiment, it is contemplated that carbon dioxide may be used in addition to or as an alternative to nitrous oxide.

Figure 5:
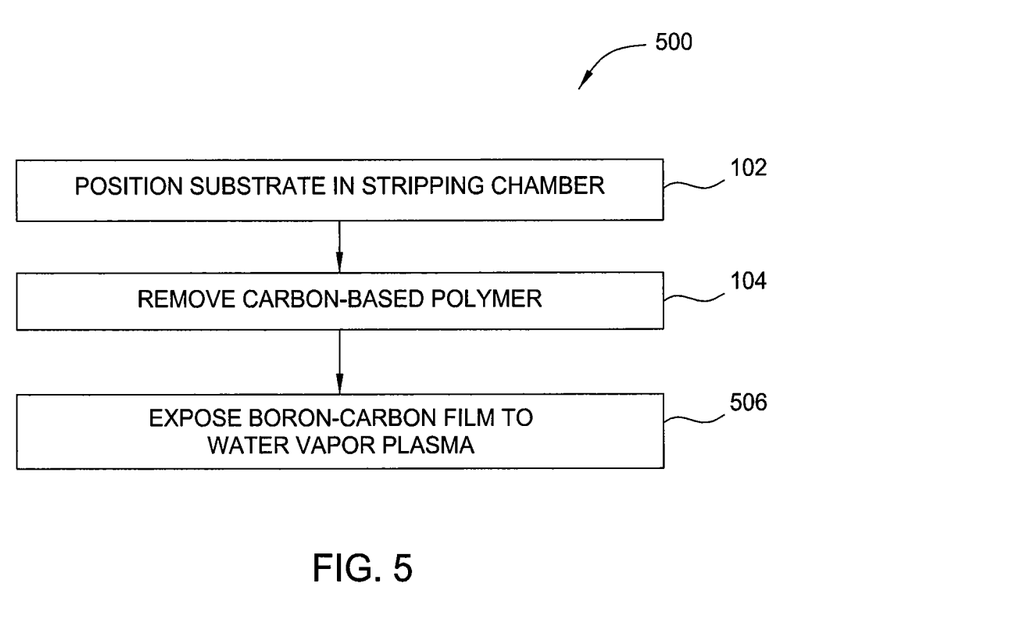
FIG. 5 is a flow diagram illustrating a method of removing a boron-carbon film using plasma generated from water vapor according to one embodiment of the invention.

FIG. 5 is a flow diagram 500 illustrating a method of removing a boron-carbon film using plasma generated from water vapor according to one embodiment of the invention. Flow diagram 500 includes operations 102, 104, and 506. Operations 102 and 104 are similar to operations 102 and 104 described with reference to flow diagram 100. After positioning a substrate on a support in operation 102, and removing the carbon-based polymer in operation 104, the substrate and the boron-carbon film thereon are exposed to a plasma formed from water vapor in operation 506.

In operation 506, water vapor is produced by a water vapor generator (WVG) and is provided to a stripping chamber where the water vapor is ignited into a plasma to etch a boron-carbon film from the surface of a substrate. The water vapor is introduced to the stripping chamber at a flow rate of about 5 SCCM to about 15,000 SCCM per 300 millimeter substrate. The substrate is maintained at a temperature less than about 750° C., such as about 300° C. to about 500° C., while the pressure in the chamber is maintained at less than about 760 Torr, such as about 10 Torr to about 50 Torr, or about 10 Torr to about 760 Torr. RF power within a range of about 10 watts to 3,000 watts is applied to the water vapor to generate a plasma containing oxygen, hydrogen, and hydroxyl ions or radicals, which react with the boron-carbon film to form volatile compounds which are exhausted from the chamber.

Flow diagram 500 illustrates one embodiment for stripping a boron-carbon film; however, additional embodiments are also contemplated. For example, it is contemplated that the water vapor may be generated via in situ steam generation. In another embodiment, it is contemplated that non-stoichiometric combinations of oxygen and hydrogen (e.g., $H_xO_y$, where x and y may be integers or non-integers both greater than zero) may be input to or generated by the WVG. In such an embodiment, some hydrogen peroxide may be generated by the water vapor generator. In another embodiment, it is contemplated that oxygen gas, helium gas, nitrogen gas, argon gas, nitrous oxide gas, and or/hydrogen gas may be provided to the stripping chamber in addition to water vapor. In such an embodiment, the addition of hydrogen has been found to increase the removal rate of the boron-carbon film, especially in boron-carbon films containing a higher concentration of boron as compared to carbon. The addition of other carrier gases, such as helium, has been observed to lower the rate of removal of the boron-carbon film, while simultaneously improving etch uniformity. In another embodiment, it is contemplated that the water vapor may be used to strip a carbon film, such as amorphous carbon, containing substantially no boron. Alternatively, it is contemplated that the water vapor may be used to strip a boron film, such as amorphous boron, containing substantially no carbon.

within a range of about 240 mils to about 270 mils. At a pressure of about 50 Torr, the spacing between the substrate and the face plate may be less than 200 mils.

Table 3 illustrates a change in etch rate of a boron-carbon film in response to a change in process gas flow rate. Each of Examples 23-30 in Table 3 includes at least 500 SCCM of helium gas as a carrier gas to increase etch uniformity, and may contain additional carrier gas, as noted in Table 3.

TABLE 3

|  | P (Torr) | Power (watts) | T (° C.) | $H_2O$ Flow rate (SCCM) | He Flow rate (SCCM) | Carrier gas (SCCM) | Etch rate (Å/min) |
| --- | --- | --- | --- | --- | --- | --- | --- |
| Example 23 | 50 | 1900 | 400 | 1000 | 250 | 0 | 679 |
| Example 24 | 50 | 1900 | 400 | 1000 | 400 | 0 | 613 |
| Example 25 | 50 | 1900 | 400 | 1000 | 250 | 150 $H_2$ | 720 |
| Example 26 | 50 | 1900 | 400 | 1000 | 250 | 350 $H_2$ | 630 |
| Example 27 | 50 | 1900 | 400 | 1000 | 250 | 150 Ar | 617 |
| Example 28 | 50 | 1900 | 400 | 1000 | 250 | 350 Ar | 527 |
| Example 29 | 50 | 1900 | 400 | 1000 | 250 | 750 Ar | 389 |
| Example 30 | 50 | 1900 | 400 | 1000 | 500 | 0 | 546 |

In another embodiment, it is contemplated that a fluorine-containing gas or a chlorine-containing gas may be ionized in operation 506 in combination with the water vapor to increase the etching rate of the boron-carbon film. In such an embodiment, operation 104 may be omitted. The fluorine-containing gas or the chlorine-containing gas is generally provided to the chamber at a flow rate between about 10 SCCM and 50 SCCM. In order to avoid undesirably etching dielectric materials present on the substrate, the flow rate of the fluorine-containing gas or the chlorine-containing gas is tapered, reduced, or eliminated when approaching the end of operation 506. It is believed that reduction in flow rate near the end of operation 106 does not undesirably etch exposed dielectric materials due to the mechanism in which the fluorine-containing gas or the chlorine-containing gas assists in removal of the boron-carbon layer.

Generally, dielectric material on the substrate is exposed in vias or trenches formed into the substrate during a previous etching process, while boron-carbon material is exposed on the upper surface of the substrate. Thus, the fluorine-containing gas or the chlorine-containing gas which enters the chamber and is ignited into a plasma generally contacts and reacts with the boron-carbon layer prior to contacting the dielectric material in the vias or trenches. However, as the boron-carbon film is removed, the probability of the fluorine-containing gas or the chlorine-containing gas contacting and undesirably removing the dielectric material is increased. Therefore, the flow rate of the fluorine-containing gas or the chlorine-containing gas is reduced as the thickness of the boron-containing layer decreases in order to reduce the probability of etching the dielectric material.

In another embodiment, when generating a capacitively coupled water vapor plasma, the spacing between the substrate and a face place located within the chamber may be within a range of about 20 mils to about 600 mils. Reduced spacing between the substrate is beneficial when processing substrates in larger volumes (for example, when processing large area substrates) under higher pressures (for example, greater than about 7 Torr). When processing substrates at pressures greater than about 7 Torr, the reduced spacing facilitates plasma sustainability. In one example, when processing a substrate at about 30 Torr, the spacing between the substrate and the face plate may be about 300 mils. At 40 Torr, the spacing between the substrate and the face plate may be As shown in Table 3, Example 29, which contains the highest total flow rate of carrier gas (250 SCCM of helium and 750 SCCM of argon) has the lowest etch rate.

Figure 6:
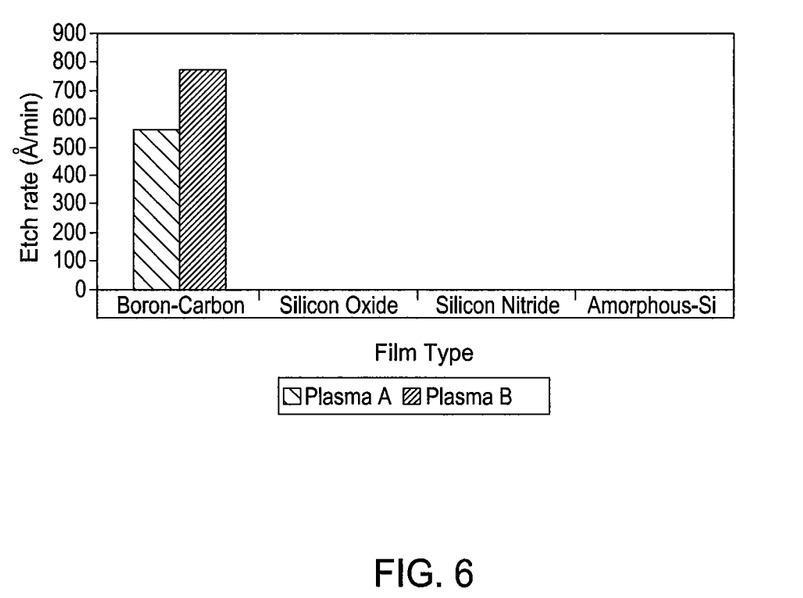
FIG. 6 illustrates the etching selectivity of water vapor plasma.

FIG. 6 illustrates the etching selectivity of water vapor plasma. Plasma A includes 1,000 SCCM of water vapor and 500 SCCM of helium generated into a plasma using 1900 watts of RF power. The stripping chamber is maintained at 50 Torr, and the substrate is maintained at 400° C. Plasma A etched the boron-carbon film at a rate of about 570 angstroms per minute, and did not etch silicon oxide, silicon nitride, or amorphous silicon.

Plasma B includes 1,000 SCCM of water vapor, 250 SCCM of helium, and 150 SCCM of hydrogen generated into a plasma using 1900 watts of RF power. The stripping chamber is maintained at 50 Torr, and the substrate is maintained at 400° C. Plasma B etched the boron-carbon film at a rate of about 770 angstroms per minute, and did not etch silicon oxide, silicon nitride, or amorphous silicon.

Benefits of the methods described herein include stripping boron-carbon films without damaging dielectric materials or underlying metal layers located on a substrate. The stripping methods allow for etching rate, as well as etching uniformity to be controlled by varying plasma composition.

While the foregoing is directed to embodiments of the present invention, other and further embodiments of the invention may be devised without departing from the basic scope thereof, and the scope thereof is determined by the claims that follow.

We claim:

1. A method for stripping a boron-carbon film from a substrate, comprising:
  positioning the substrate having the boron-carbon film thereon in a chamber;
  exposing the boron-carbon film to a plasma containing oxygen radicals or ions and hydrogen radicals or ions;
  reacting the hydrogen radicals or ions with the boron to form a volatile boron species;
  reacting the oxygen radicals or ions with the carbon to form a volatile carbon species; and
  exhausting the volatile boron species and the volatile carbon species from the chamber, wherein the exposing the boron-carbon film comprises:

introducing a processing gas comprising $H_xO_y$ to the chamber, wherein x and y are integers or non-integers greater than 1; and generating a plasma from the processing gas.

2. The method of claim 1, wherein the processing gas comprising $H_xO_y$ comprises water vapor.

3. The method of claim 2, wherein the exposing the boron-carbon film comprises:

generating water vapor using a water vapor generator;
flowing the water vapor into the chamber; and
forming a plasma from the water vapor using RF power.

4. The method of claim 1, wherein a pressure within the chamber is greater than about 5 Torr, and the substrate is positioned less than about 600 mils from a surface of a face plate located within the chamber.

5. A method for stripping a boron-carbon film from a substrate, comprising:

positioning the substrate having the boron-carbon film thereon in a chamber;
exposing the boron-carbon film to a plasma containing oxygen radicals or ions and hydrogen radicals or ions;
reacting the hydrogen radicals or ions with the boron to form a volatile boron species;
reacting the oxygen radicals or ions with the carbon to form a volatile carbon species; and
exhausting the volatile boron species and the volatile carbon species from the chamber, wherein the exposing the boron-carbon film comprises:

introducing a processing gas comprising $H_xO_y$ and at least one of an oxygen-containing compound, or a hydrogen containing compound to the chamber, wherein x and y are integers or non-integers greater than 1; and generating a plasma from the processing gas.

6. A method for stripping a film comprising boron and carbon from a substrate, comprising:

positioning the substrate having the film thereon in a chamber;
exposing the film to a plasma comprising oxygen ions or radicals and hydrogen ions or radicals, wherein the plasma is formed from a compound comprising $H_xO_y$, where x and y are integers or non-integers greater than 1;
reacting the hydrogen radicals or ions with the boron to form a volatile boron species and reacting the oxygen radicals or ions with the carbon to form a volatile carbon species by contacting the film with the plasma; and
exhausting the volatile boron species and the volatile carbon species from the chamber.

7. The method of claim 6, wherein a pressure within the chamber is greater than about 5 Torr, and the substrate is positioned less than about 600 mils from a surface of a face plate located within the chamber.

8. The method of claim 6, wherein the substrate is maintained at a temperature within a range of about 200° C. to about 400° C.

* * * * *